United States Patent [19]
Guiberteau et al.

[11] Patent Number: 5,017,924
[45] Date of Patent: May 21, 1991

[54] SAMPLE-AND-HOLD UNIT WITH HIGH SAMPLING FREQUENCY

[75] Inventors: Christian Guiberteau, Longjumeau; Michéle Le Paih, Bievres; Stéphane Ruggeri, Viry, all of France

[73] Assignee: Thomson Composants Microondes, Puteaux, France

[21] Appl. No.: 514,888

[22] Filed: Apr. 26, 1990

[30] Foreign Application Priority Data

May 3, 1989 [FR] France .................................. 89 05871

[51] Int. Cl.[5] ................................................ G01S 7/02
[52] U.S. Cl. ..................................... 342/195; 307/352; 328/151
[58] Field of Search ................. 342/195, 175; 307/352, 307/353; 328/151

[56] References Cited
U.S. PATENT DOCUMENTS

| | | | |
|---|---|---|---|
| 3,701,152 | 10/1972 | Howard | 343/16 M |
| 4,512,000 | 4/1985 | Masuko | 367/93 |
| 4,516,126 | 5/1985 | Masak et al. | 342/383 |
| 4,652,882 | 3/1987 | Shovlin et al. | 342/150 |
| 4,697,184 | 9/1987 | Cheal et al. | 342/28 |
| 4,721,924 | 1/1988 | Masdea et al. | 331/1 R |

FOREIGN PATENT DOCUMENTS 0260375 3/1988 European Pat. Off. .
2455517 6/1975 Fed. Rep. of Germany .

Primary Examiner—John B. Sotomayor
Attorney, Agent, or Firm—Oblon, Spivak, McClelland, Maier & Neustadt

[57] ABSTRACT

Disclosed is a sample-and-hold unit more especially designed to work at microwave frequencies (>1 GHz). In order to increase the sampling frequency, the disclosed circuit has at least two identical parallel channels. Each channel has a first follower switch (9) a capacitor (11) and a second holding switch (15). The channels are controlled by a single clock, the complementary or phase-shifted signals (H, $\overline{H}$) of which address the samples sequentially towards the output (8). The disclosed device can be applied to the processing of analog signals.

7 Claims, 1 Drawing Sheet

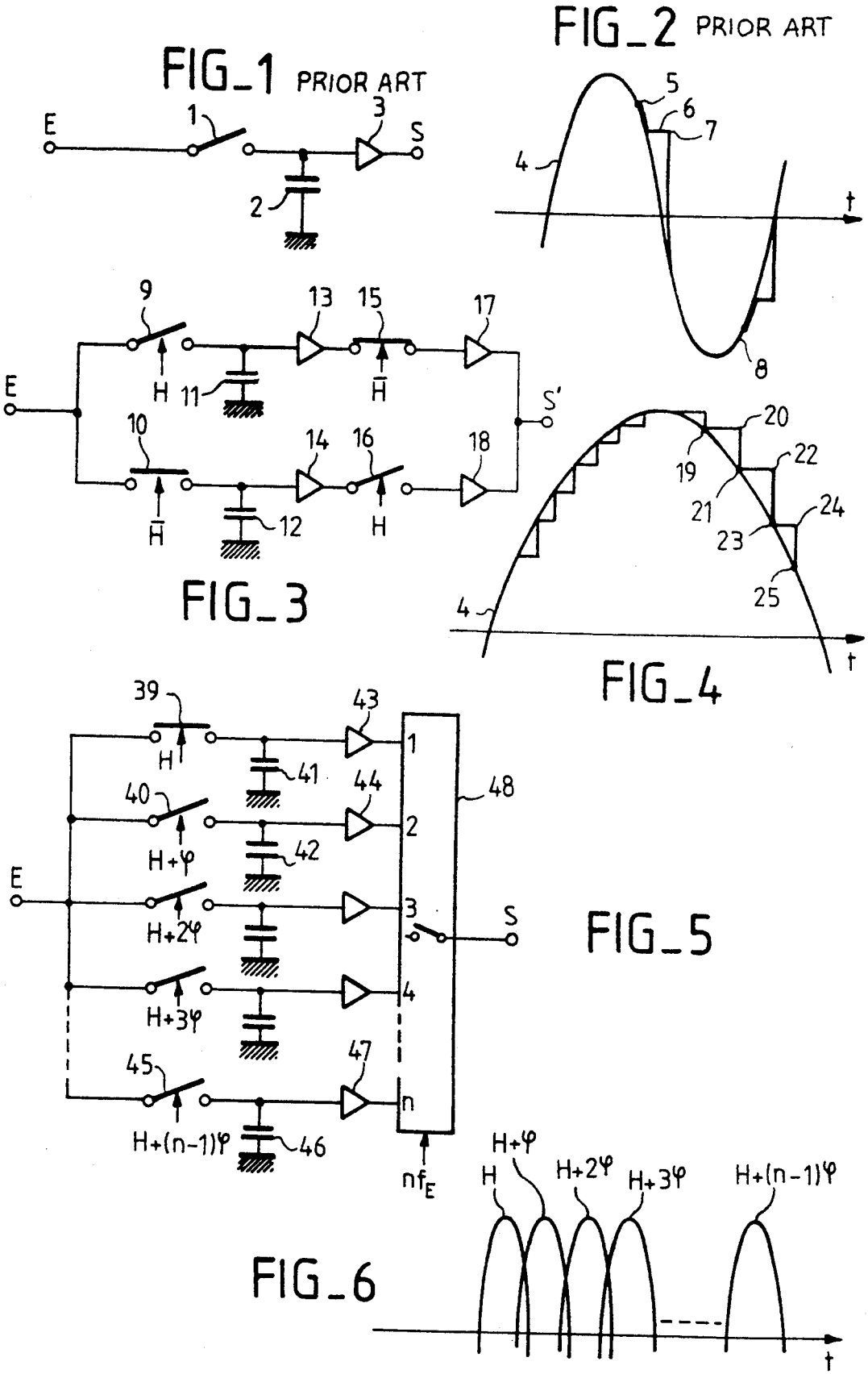

SAMPLE-AND-HOLD UNIT WITH HIGH SAMPLING FREQUENCY

BACKGROUND OF THE INVENTION

1. Field of the Invention

The present invention concerns a structure of a sample-and-hold unit which can be made either in integrated circuit form on silicon or III-V group materials such as GaAs or in hybrid circuit form. The particular feature of this sample-and-hold unit is that it delivers at least twice as many samples as a standard sample-and-hold unit, even if the sampling frequency is equal to the clock frequency of the signal to be sampled.

2. Description of the Prior Art

It is known that sample-and-hold units, abbreviated as S-Hs, are used in the processing of electrical information. For example, in the digitization of an analog signal a S-H samples a number of instantaneous values of an analog signal, and these values, addressed to an analog-digital converter, are converted into a binary number.

There are different S-H structures using either a transistor or a diode bridge, but the organization common to all of them is shown schematically in FIG. 1. A switch 1 (when closed) transmits the analog signal, present at the input E to a capacitor 2. Equilibrium is set up and the capacitor 2 gets charged. The switch 1 is then opened, and the capacitor 2 transmits the memorized information, often through an amplifier, to a circuit connected to the output S which is often an analog-digital converter. Then a new sample is taken by closing the switch 1 again.

This is what is shown in FIG. 2, where a period of an analog signal 4 is sampled at the point 5. As long as the switch 1 is closed, between the points 5 and 6, the sampler follows the variation of the signal. During the time represented by the segment 6-7, the switch is open, and the capacitor 2 transmits the sample value. At 7, the switch is again closed. The sampler catches up with and then follows the signal 4 up to the next sample.

The sample-and-hold units presently available in the market have acquisition times (<500 ps) that make it possible to obtain input signal frequencies of up to 1 GHz. This acquisition time depends on the memorizing capacity.

Thus, in a sample-and-hold unit, the output signal is broken down into a sequence of stages of catching up with, following and holding the input signal. Of all these stages, the only really interesting ones are the holding stages which correspond to the information contained earlier in the input signal. The other stages, although inherent to the system, contain no useful information. For it to be possible to reconstitute the input signal, the frequency of the sampling signal should be at least twice that of the input signal. This therefore calls for two samples to be taken during one period of the input signal in order to comply with the Nyquist theorem or Shannon theorem. In FIG. 2, the signal 4 should be sampled, for example, at 5 or 8, during one period.

At microwave frequencies, increasing the sampling frequency becomes complicated owing to the uncertainty about the instant of opening or closing of the switch 1, which remains a semiconductor device having, therefore, a switching time.

The architecture of the S-H according to the present invention enables doubling of at least the number of samples given during a period of the input signal, without modifying the sampling frequency or, in what amounts to the same thing, doubling the frequency of the input signal without adversely affecting the linearity performance characteristics.

This result is obtained by means of an S-H structure in which at least two sampling channels work in parallel. These channels are controlled either by the two complementary signals H and $\overline{H}$ of one and the same clock, if there are only two channels or by the phase-shifted signals of one and the same clock if there are more than two channels. But irrespectively of the number of channels in parallel, only the holding stages are transmitted at the output. Consequently, a first channel may follow the signal while a second channel transmits it at the output and a third channel catches up with the signal.

SUMMARY OF THE INVENTION

More precisely, the present invention concerns a sample-and-hold unit with a high sampling frequency, of the type having a capacitor, a first switch designed to load a sample of the input signal into the capacitor during a stage called a stage for following the input signal and a second switch designed to transfer the sample to the output during a stage called a holding stage, the sample-and-hold unit comprising at least two identical parallel channels controlled by a single sampling clock, each channel making a sequential transmission to the output, during its holding stage, of the sample loaded in the capacitor of the channel.

BRIEF DESCRIPTION OF THE DRAWING

The invention will be understood more clearly from the more detailed description of two exemplary embodiments, made with reference to the appended drawing, wherein FIGS. 1 and 2 are a reminder of the working of a sample-and-hold unit according to the prior art, explained above;

FIG. 3 shows a structure of an S-H according to the invention;

FIG. 4 shows a curve, as a function of time, of a half-period of a signal to be analyzed, showing the working of the S-H according to the invention, FIG. 5 shows a structure of a variant of the S-H according to the invention;

FIG. 6 shows a timing diagram of the clock signals for controlling the S-H of the previous figure.

DESCRIPTION OF PREFERRED EMBODIMENTS

The present invention pertains more to an architecture of a sample-and-hold unit than to the specific means implemented to achieve this architecture. This is why FIGS. 3 and 5 retain the symbols of a switch which may be either a transistor controlled by its gate or a bridge diode, namely devices that are well known per se.

FIG. 3 shows a diagram of a preferred embodiment of the S-H according to the present invention. It is preferred because of its simplicity which ensures that it performs well at microwave frequencies. Between an input terminal E, to which an analog signal such as 4 (FIG. 4) is applied, and an output terminal S, it has two channels that are parallel and identical, except for the clock signals.

The first channel has:

a first switch 9 called a follower switch controlled by a clock signal H, a capacitor 11, loaded through the first switch when it is closed;

an amplifier 13;

a second switch 15, called a holding switch controlled by a clock signal $\overline{H}$ which is complement of H;

an amplifier 17.

The second channel is identical, but the third and fourth switches 10 and 16 are controlled by clock signals that are complements of those controlling the first and second switches 9 and 15, namely $\overline{H}$ (10) and H (16).

The signals H and $\overline{H}$ may be permutated with each other.

The four amplifiers, which are better known as buffers, are not indispensable, but it is well known that that they are placed in the circuits to compensate for the line insertion losses. Also, they make it possible to prevent charge transfers and, hence, prevent the discharging of the capacitors 11 and 12, which would falsify the samples The basis of this S-H is that one channel follows the signal while the other channel transmits, at the output, the sample taken during the previous clock period.

Thus, as shown in FIG. 3:

on the first channel, at a certain time, the switch 9 is open (H), the switch 15 is closed ($\overline{H}$) and transmits, at the output, the sample contained in the capacitor 11.

but, simultaneously with, and no longer after, this instant as in a prior art S-H, the switch 10 is closed ($\overline{H}$) and it loads the capacitor 12 with the signal present at the input E, the output S being isolated by the open (H) switch 16.

At the following clock period, the second channel will deliver a sample at output S, and the first channel will recharge the capacitor 11.

Hence, only the holding stages are transmitted at the output, the following stages being isolated by the switches. Everything happens as if the sampling frequency were twice what it actually is.

This is brought out in FIG. 4, where a half-period of the signal is sampled a great many times. Let it be assumed that, at the point 19, the first channel transmits the stored sample at the output. This transfer lasts for the time H of a clock half-period up to 20. But, during this very period, the second channel follows the signal from 19 to 21, and loads the capacitor 12. During a second clock half-period, the second channel transmits the sample from 21 to 22 and, simultaneously, the first channel catches up with the signal and then follows it from 21 to 23. During a third clock half-period 23-24-25, the system has resumed the same cycle as during the first clock half-period 19-20-21

This S-H structure with two channels uses only one sampling clock that gives two complementary signals H and $\overline{H}$. It is possible to extend it to more than two channels, with only one sampling clock, the signal of which is phase-shifted several times.

The variant of an S-H shown in FIG. 5 has n parallel channels, each formed, like the first one, by a switch 39, a capacitor 41 and a buffer 43. However, as it is not possible to be restricted to only two signals H and $\overline{H}$ for n channels, the switches 39. 40 . . . 45 are controlled by a clock signal H for the first channel, phase-shifted by a value $\Phi$ for the second channel, by a value 2$\Phi$ for the third channel by a value (n-1)$\Phi$ for the nth channel, as shown in FIG. 6.

With a clock signal, it is easy to obtain signals phase-shifted by $\psi$, 2$\psi$, 3$\psi$ . . . n$\psi$, either by means of a phase-shifter circuit with several stages or by means of cascade-mounted delay lines.

The sequential control of the switches 39, 40 . . . 45 enables the capacitors 41, 42 . . . 46 to be charged one after another to take a large number of samples of the input signal, or a more restricted number of samples, but on an input signal at a higher frequency. That is, since each channel complies with the Nyquist theorem, the set of channels no longer complies with it and, with a frequency of the sampling signal $f_E$ equal to the frequency of the input signal, it is possible to have a great number of samples for one period of the input signal while, according to the prior art, the sampling frequency should be equal to or at least twice the input frequency.

But it is also possible (this is only a question of phase-shifting) to operate with a certain partial overlapping of the periods for following the signal and for charging the capacitors. In this case, one channel starts charging its capacitor before the previous channel has finished charging its own capacitor, thus enabling a further increase in the number of samples.

Whereas, at the input, a certain period of time is needed to charge the capacitors, at the output the transfer to an analog/digital converter is almost instantaneous. This is why there is provision for a multiplexer 48, which interrogates each channel one after the other and transfers the samples contained into the capacitors 41, 42 . . . 46. If $f_E$ is the sampling frequency applied to the switches 39, 40 . . . 45 of the n channels, the multiplexer is controlled by a clock signal at a frequency n$f_E$, which is easily obtained by means of a frequency multiplier.

It is clear to those skilled in the art that, for the embodiment in the form of integrated circuits on silicon or fast materials such as GaAs, the switching-over means represented by the symbol for a switch are actually field-effect or bipolar transistors. In microwave applications, these transistors have their source connected to the input E and their drain connected to the sampling capacitor, and they are controlled at their gate by the clock signal.

The sample-and-hold unit according to the present invention is preferably used in microwave applications, for signal processing in telecommunications, radars and Hertzian wave links.

What is claimed is:

1. A sample and hold unit comprising:
    an input for receiving an input signal;
    at least two parallel circuits, each receiving said input signal and each parallel circuit comprising:
    a first follower switch to load a sample of said input signal into a capacitor when said first switch is closed;
    a second holder switch to transfer the loaded sample to an output when said second switch is closed;
    a sampling clock signal for controlling said first and second switches of a first parallel circuit; and
    at least one phase-shifted sampling clock signal for controlling said first and second switches of a respective at least one second parallel circuit;
    wherein each of said parallel circuits sequentially transmits to said output the sample loaded in the capacitor of said respective parallel channel when said second switch of said respective parallel channel is closed.

2. A sample-and-hold unit according to claim 1 comprising only two parallel circuits, wherein the single sampling clock gives the complementary clock signals H and $\overline{H}$, one of which, namely H, is applied to the following switch of a first circuit and to the holding switch of a second circuit, and the complement of which, namely $\overline{H}$, is applied to the holding switch of a first circuit and to the following switch of a second circuit.

3. A sample-and-hold unit according to claim 2, wherein amplifiers are interposed in each circuit behind the switches in order to prevent transfers of charges between circuits.

4. A sample-and-hold unit according to claim 1, comprising a plurality of identical, parallel circuits, the second switches of which are brought together in a single multiplexer which makes a sequential transmission, to the output, of the sample loaded in the capacitor of a given circuitry.

5. A sample-and-hold unit according to claim 4, wherein a single sampling clock controls the first follower switches by means of phase-shifted signals (H, $H+\Phi$, $H+2\Phi$ ..., $H+(n-1)\Phi$), and the multiplexer by means of a signal, the frequency of which is a multiple ($nf_E$) of the sampling frequency ($f_E$) on the parallel circuits, the coefficient of multiplication being equal to the number of parallel circuits.

6. A sample-and-hold unit according to claim 4, wherein there is a partial overlapping between the periods of following the input signal of two adjacent circuits, with one circuit beginning to load its capacitor before the preceding circuit has finished loading its own.

7. A sample-and-hold unit according to any one of claims 1 or 2, wherein the switches are transistors.

* * * * *